United States Patent
Sobel et al.

(10) Patent No.: US 6,294,735 B1
(45) Date of Patent: Sep. 25, 2001

(54) LATCHING DEVICE FOR A CIRCUIT PACK

(75) Inventors: Jay R. Sobel, Nepean; Raymond Woo, Ottawa; Bevin G. Schmidt, Dunrobin; Willi M. Lotz, Carp, all of (CA)

(73) Assignee: Alcatel Canada Inc., Kanata (CA)

( * ) Notice: Subject to any disclaimer, the term of this patent is extended or adjusted under 35 U.S.C. 154(b) by 0 days.

(21) Appl. No.: 09/399,779

(22) Filed: Sep. 21, 1999

(30) Foreign Application Priority Data

Mar. 11, 1999 (CA) .................................................... 2265175

(51) Int. Cl.$^7$ ........................................................ H02G 3/14
(52) U.S. Cl. ................................ 174/67; 174/66; 174/135
(58) Field of Search .................................. 174/40 CC, 60, 174/66, 67, 724, 135, 250; 361/826, 827, 828; 385/134, 135, 136; 248/49, 53, 74.4

(56) References Cited

U.S. PATENT DOCUMENTS

| | | | | |
|---|---|---|---|---|
| 3,297,815 | * | 1/1967 | Drettmann | 174/135 |
| 4,301,494 | * | 11/1981 | Jordan | 361/798 |
| 4,451,101 | * | 5/1984 | Davis | 174/67 |
| 4,632,588 | * | 12/1986 | Fitzpatrick | 361/759 |
| 4,648,009 | * | 3/1987 | Beun et al. | 361/759 |
| 4,799,444 | * | 1/1989 | Lisowski | 248/74.4 |
| 4,860,980 | * | 8/1989 | Michot | 248/74.4 |
| 4,947,289 | * | 8/1990 | Dynie | 361/801 |
| 5,728,976 | * | 3/1998 | Santucci et al. | 174/135 |
| 5,949,946 | * | 9/1999 | Debortoli et al. | 385/134 |

* cited by examiner

Primary Examiner—Dean A. Reichard
Assistant Examiner—Angel R. Estrada
(74) Attorney, Agent, or Firm—Blake, Cassels & Graydon LLP

(57) ABSTRACT

A latching device is provided for a circuit pack having a cable retainer carried upon the front of the operating lever of the device. The cable retainer is oriented for positional and directional control of cable by directing cable longitudinally of the faceplate of the circuit pack and away from the fronts of other circuit packs within a shelf.

Also provided is a combination of a latching device and two groups of covers. The combination enables a single latching device to be used upon circuit packs requiring security and non security conditions within a shelf. It also enables removal of a faceplate held to a faceplate mounting with the circuit pack in the shelf. An orifice in an operating lever of the device is accessible with a cover of the first group mounted upon the operating lever, as orifices in these covers align themselves with the orifice in the operating lever. Where use of the operating lever orifice is not required, then a selected cover of the second group is mounted upon the operating lever and this cover, having no orifice, obscures the orifice in the operating lever. The covers are differentiated from one another by printed notation. This relates to the uses of different circuit packs. The covers may also include cable retainers provided with or without orifices.

32 Claims, 7 Drawing Sheets

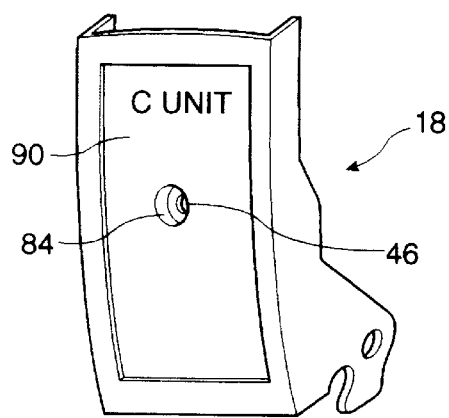
Figure 9
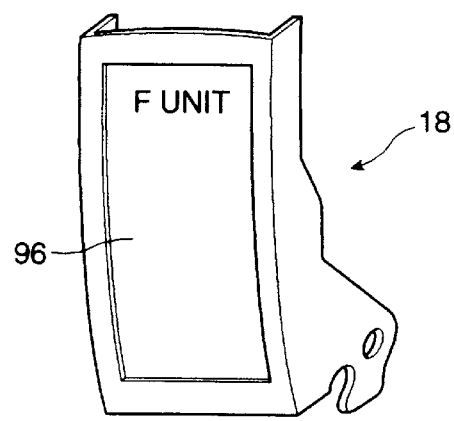
Figure 12
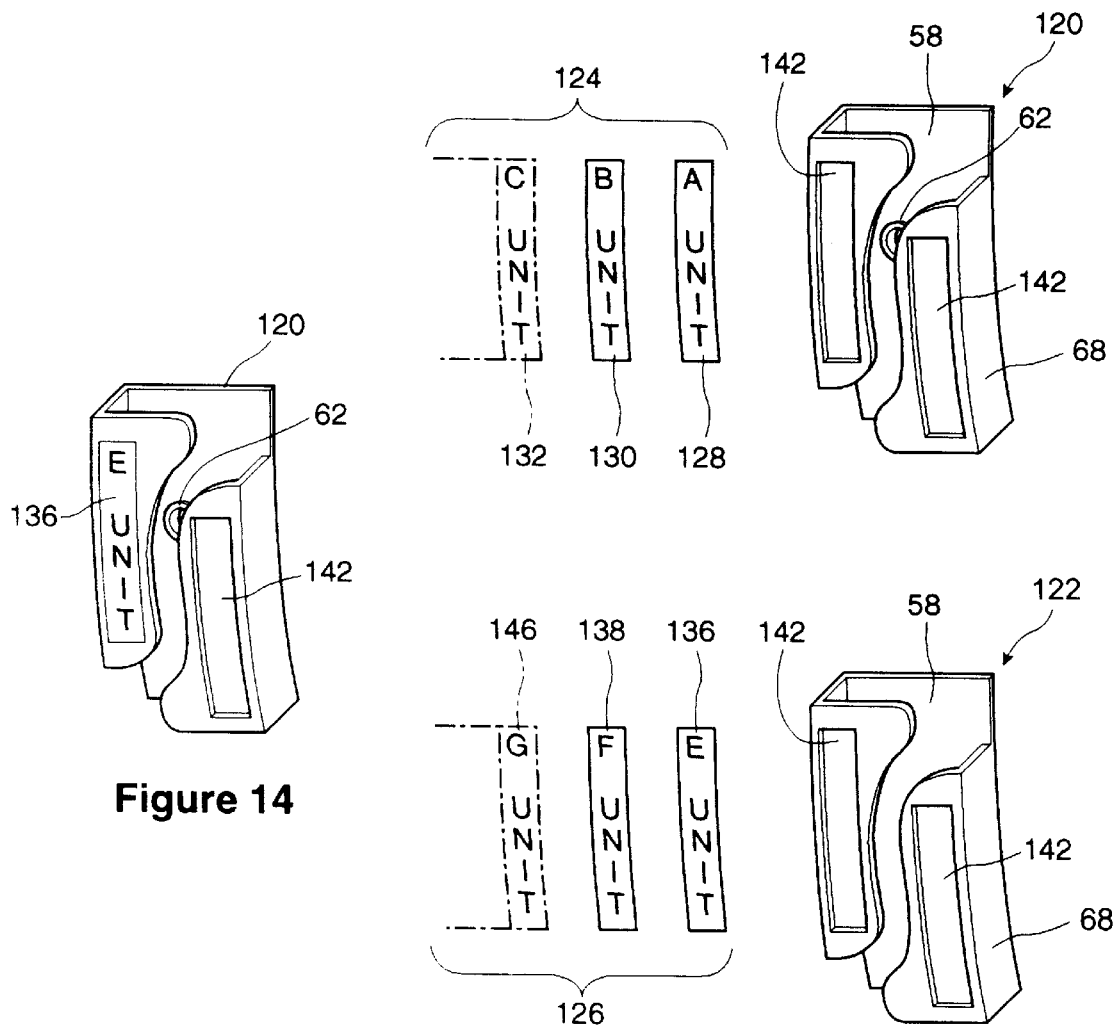
Figure 14
Figure 13

LATCHING DEVICE FOR A CIRCUIT PACK

FIELD OF THE INVENTION

This invention relates to latching devices for circuit packs as used in the electronics industry.

BACKGROUND OF THE INVENTION

In the electronics industry, it is conventional practice to provide shelves in electronic apparatus, the shelves having receiving stations for sliding reception of circuit packs. A circuit pack conventionally comprises at least one circuit board to be received within a shelf, and a faceplate mounted at a front of the circuit board to be seen from outside the shelf with the circuit pack mounted in position. To hold a circuit pack correctly in an operating position in its shelf with a connector at the rear of the circuit board held positively in engagement with a an corresponding connector in a back plane, latching devices are used. These latching devices are mounted upon the faceplate of the circuit pack and have latched positions in which they engage into recesses in the shelf when the circuit pack is in its operating position. Each latching device needs to be pivoted out of its latched position for removal of its circuit pack, movement out of the latched position also serving to provide leverage to the latching device for urging the circuit pack forwards out of its operating position.

There is a problem which presents itself in cases where electrical cables are required at the fronts of shelves for connection to electrical connectors facing forwardly from the circuit packs. In these cases, difficulty has been found in positional control of the cables which tend to extend haphazardly across the fronts of circuit packs other than the individual packs which the cables actually serve. Hence, in at least some positions along a shelf, in order to remove a circuit pack, the haphazardly placed cables need to be flexed aside from the path of movement of the circuit pack to enable it to be removed from its shelf. Later insertion of a circuit pack then again requires flexing of cables out of the path of the circuit pack. These cable movements serve to unduly stress cable which may eventually result in damage occurring to the cable. The cable movement may be tedious and difficult to perform if cables are to be kept out of contact with a circuit pack during its removal and insertion into a shelf.

In addition, in certain situations, e.g. when circuit packs are held in shelves at central offices, security of electronic equipment may not be a consideration and restrictions need not be placed upon freedom for any person to remove from and insert circuit packs into the shelves. However, should security requirements be necessary, e.g. when installed in customers' premises, it is not unusual to render a latching device immovable when in its latched position so as to prevent circuit pack removal by unauthorized persons. Latching devices are normally rendered immovable by the use of securing members such as quick release pins or screws which are secured to the faceplates.

The above use of securing members also lessens the possibility of removal of a circuit pack from its shelf in error. In cases of such use, it is considered that error in circuit pack removal is less likely to occur if personnel are required to release a securing member before a latching device can possibly be moved out of its latched position. This is because to release the securing member provides more time for the person performing this function to realize that a mistake is being made. Securing members conventionally extend through securing member receiving orifices defined through the latching devices.

In certain other circuit pack constructions it is desirable to remove faceplates from their circuit boards while the circuit boards remain in their operating positions in shelves. This enables test connectors to be reached at the fronts of the shelves for test purposes during operating conditions of the circuit boards. These faceplates are normally secured by securing members to faceplate mounts of the circuit packs so as to allow for complete removal of the circuit packs commenced by movement of the latching devices out of the latched positions, as discussed above. To allow a faceplate to be removed conveniently from its faceplate mount when in the shelf, the securing members may be reached through access orifices provided in the latching devices. Removal of these securing members then permits faceplate withdrawal from its mount during normal pivoting of the latching devices out of their latched positions.

To provide for all the requirements of the above constructions, some latching devices are required without the necessary apertures, i.e. when there are no security requirements relating to circuit pack removal; other latching devices are required with apertures for security reasons or faceplate removal. Normally, latching devices are made from die cast metal parts at inordinate expense particularly when some, but not all, of these devices are required with apertures. Apart from requiring therefore two different structures of latching device, the apertures need to be machine made which is an expensive procedure.

SUMMARY OF THE INVENTION

The present invention seeks to overcome or minimize the above discussed problems.

According to one aspect of the present invention, a latching device is provided having an operating lever having means for pivotally mounting the device to a faceplate, the operating lever extending generally in a radial direction relative to the axis of the pivotal mounting means, and a cable retainer provided upon the lever to direct cable in a radial direction relative to the axis of the pivotal mounting means.

The above latching device according to the invention, when assembled to a faceplate has its operating lever extending longitudinally of the faceplate. Hence, cable provided at the front of the shelf is directionally and positionally controlled by the retainer to extend longitudinally in front of its faceplate to a connector extending forwardly of its circuit pack. The cable does not lie in front of or extend across other circuit packs. It follows that such cable does not need to be flexed to allow for removal of any other circuit pack from its operating position within a shelf whereby the cable requires to be moved only prior to removal of its own circuit pack. Further to this, the cable positioned within the cable retainer inhibits movement of the latching device out of a latched position upon the faceplate. Thus, the person proceeding to remove a circuit pack from its operating position within the shelf, needs firstly to deal with removal of the cable from the retainer, and thus has an extended time in which to contemplate whether he is in fact removing an incorrect circuit pack. It follows, therefore, that with the use of the cable retainer on the latching device, mistakes in removing incorrect circuit packs should be minimized.

In a latching device according to the invention the cable retainer may be formed integrally with the operating lever. Preferably however, the cable retainer is held by a mounting means to the operating lever as the resultant two part construction is simpler to manufacture than an integral one. The mounting means conveniently may comprise latch elements and latch engaging surface elements provided upon the operating lever and upon the cable retainer.

The invention also includes an arrangement of elongate faceplate and latching device in which the latching device is according to the invention as discussed above.

According to a further aspect of the invention there is provided in combination a latching device comprising an operating lever formed with an orifice extending through the lever from front to rear and a plurality of covers which are visually differentiated from one another, the covers being alternatively selectable for mounting in predetermined location upon the front of and covering at least part of the operating lever. At least one of the covers has an orifice provided in a specific position whereby the orifice of this particular cover is aligned with the orifice of the operating lever when the cover is mounted in the predetermined location. At least one other cover is devoid of an orifice provided at the specific location whereby when this particular cover is mounted in the predetermined location, it extends across and obscures the orifice of the operating lever. For mounting purposes, the lever is preferably provided with at least one register for registration of a selected cover to position it in its predetermined location.

Preferably, there are two groups of the covers. In a first of the groups, each cover is formed with an orifice while in the second group, the covers have no such orifices. The orifice in the operating lever is provided, in one arrangement of the inventive combination, to receive a lever securing member which is secured to a faceplate carrying the latching device so as to hold the latching device in a latched position. In another arrangement of the combination, the latching device is to be mounted upon a circuit pack in which the faceplate is removable while the remainder of the pack is retained its operating position in a shelf. In this latter arrangement, the orifice in the operating lever provides access to a securing member which holds the faceplate to its faceplate mount.

In either of the above two arrangements involving the use of securing members, a desired cover of the first group, i.e. with its own individual orifice is mounted upon the operating lever with its orifice aligned with the orifice in the operating lever also to provide access to the locking member. In another arrangement, however, in which no security is required for a circuit pack, then no securing member is used and the selected cover is chosen from the second group of covers. Thus, when this selected cover is placed in its predetermined location upon the operating lever, it conveniently covers the orifice in the operating lever as viewed from the front of the shelf. This provides a more pleasing appearance.

Where a plurality of covers are formed with orifices, then these particular covers are themselves visually distinguished from one another so as to indicate specific functions of circuit packs. The visually differentiating features may be provided in any desirable manner such as by the use of colors, symbols, indicia, shapes, configurations or letters, or combinations thereof. Preferably, these covers are individually distinguished by nomenclature, number, or letter notations, specifically to the use of circuit packs. Where a plurality of covers are provided without orifices, the above comments regarding differentiating features also apply.

Conveniently, covers are substantially planar in form so that they may be cut easily from sheet material or may be easily molded; the distinguishing features are subsequently printed thereon.

It follows from the inventive combination, that a single design of latching device is usable with each of the three possible situations discussed, i.e. for non-security and security situations and the further situation in which a faceplate is required to be removed. The covers serve alternatively to cover or leave access to the aperture in the latching device, as required for each of these above situations, while also providing the required information concerning the use of particular circuit packs. Further advantage is obtained in the inventive combination when the latching device, and preferably also the covers, are made from a suitable plastics material, e.g. a polycarbonate material. With use of planar covers, particularly, this serves to minimize cost especially when using plastics materials.

In a further preferred arrangement of the combination, a cover is provided which is a cable retainer for attachment to the operating lever. A plurality of visually differentiated labels are provided for selection of a suitable label for attachment to the cable retainer to provide information concerning the uses of circuit packs.

DESCRIPTION OF THE DRAWINGS

Embodiments of the invention will now be described, by way of example, with reference to the accompanying drawings, in which:

FIG. 9 is an isometric view of the latching device of FIG. 8 fitted with a selected cover;

FIG. 12 is an exploded view of the latching device of FIG. 8 fitted with a different selected cover;

FIG. 13 relates to a second modification of the second embodiment and is an isometric view of a further cover and alternatively selectable identification labels as an addition to the combination of the second embodiment; and FIG. 14 is a view similar to FIG. 6 and shows the cover of FIG. 13 fitted with a chosen identification label.

DESCRIPTION OF PREFERRED EMBODIMENTS

Figure 1:
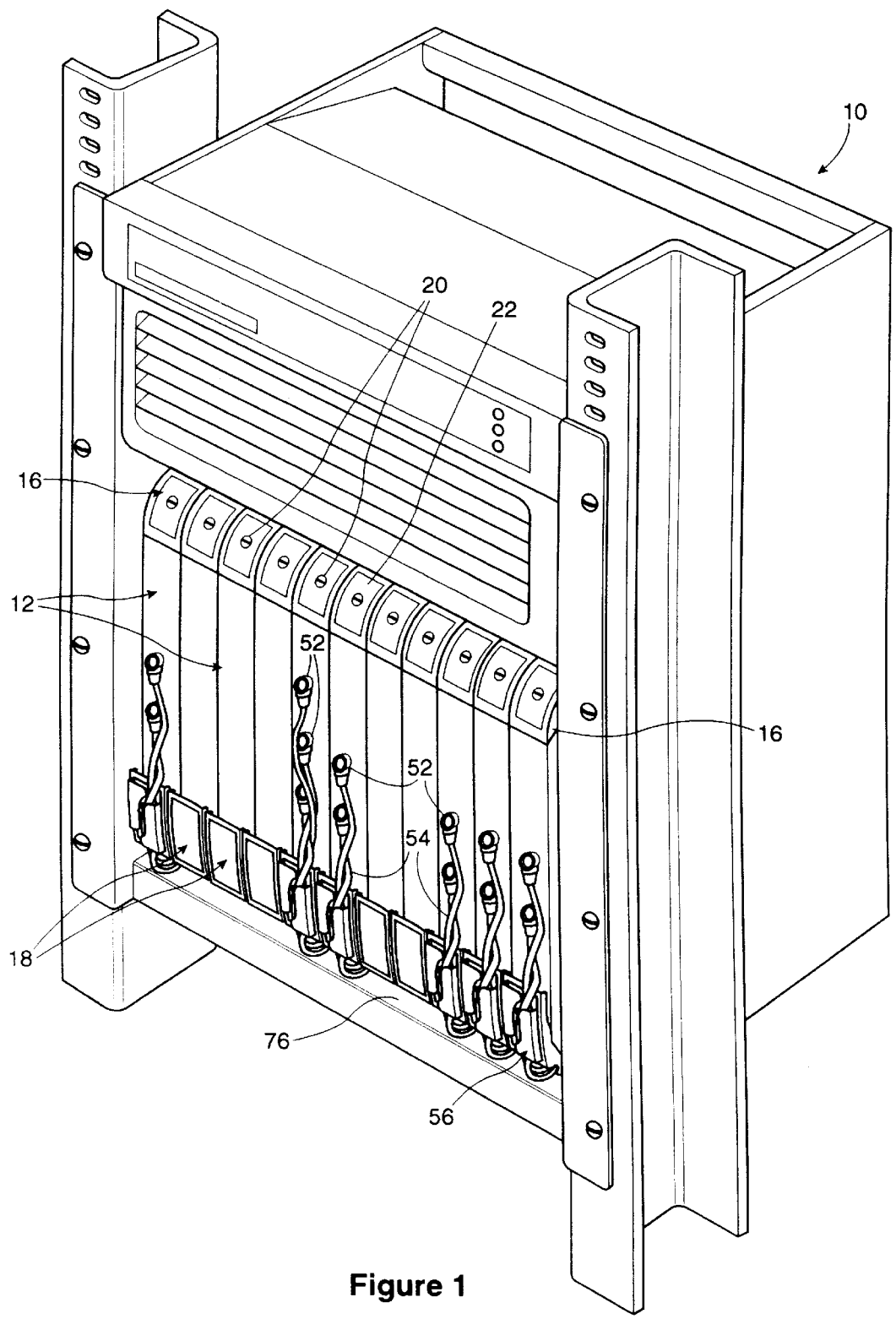
FIG. 1 is an isometric view of a shelf fitted with a plurality of circuit packs each having a latching device according to a first embodiment of the invention.
Figure 2:
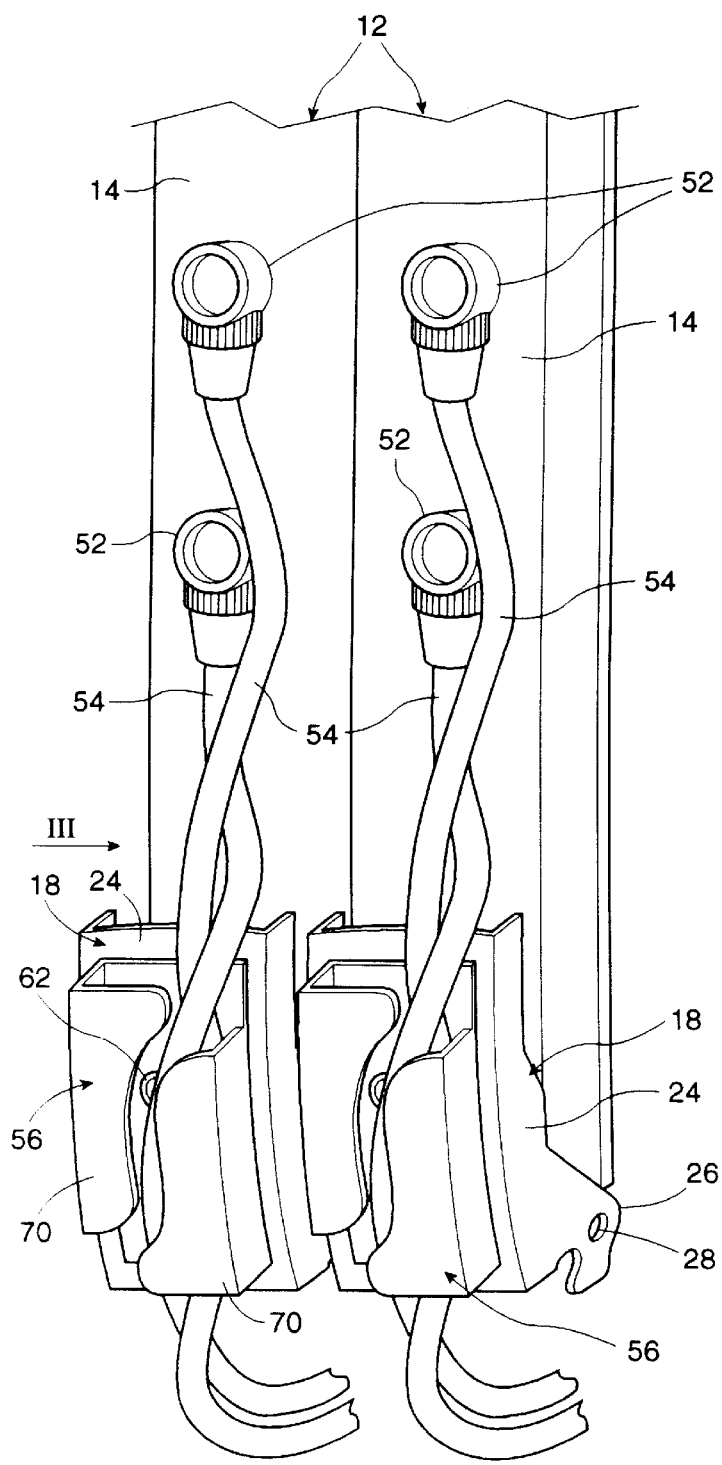
FIG. 2 is an isometric view of part of the structure of FIG. 1 and to a much larger scale.

In a first embodiment, as shown by FIGS. 1 and 2, in electronic apparatus, a shelf 10 is provided. The shelf 10 is of conventional construction having an open front for the sliding reception of circuit packs 12 into operating positions in receiving stations, as is also conventional. Each of the circuit packs comprises a circuit board 13 (FIG. 3) within the receiving station and a faceplate 14 which is viewed from the front of the shelf, as may be seen from FIGS. 1 and 2. Each circuit pack is held in its operating position with its faceplate extending vertically with top and bottom latching devices 16 and 18. The shelf containing the circuit packs 12 is installed on a customer's premises and the circuit packs form parts of a power supply unit and hence the packs need to be made secure against unauthorized removal. The upper latching devices 16 are of conventional construction and have securing members 20 passing through operating levers 22 into the faceplates 14 to secure the latching devices in latched positions according to conventional practice.

Figure 3:
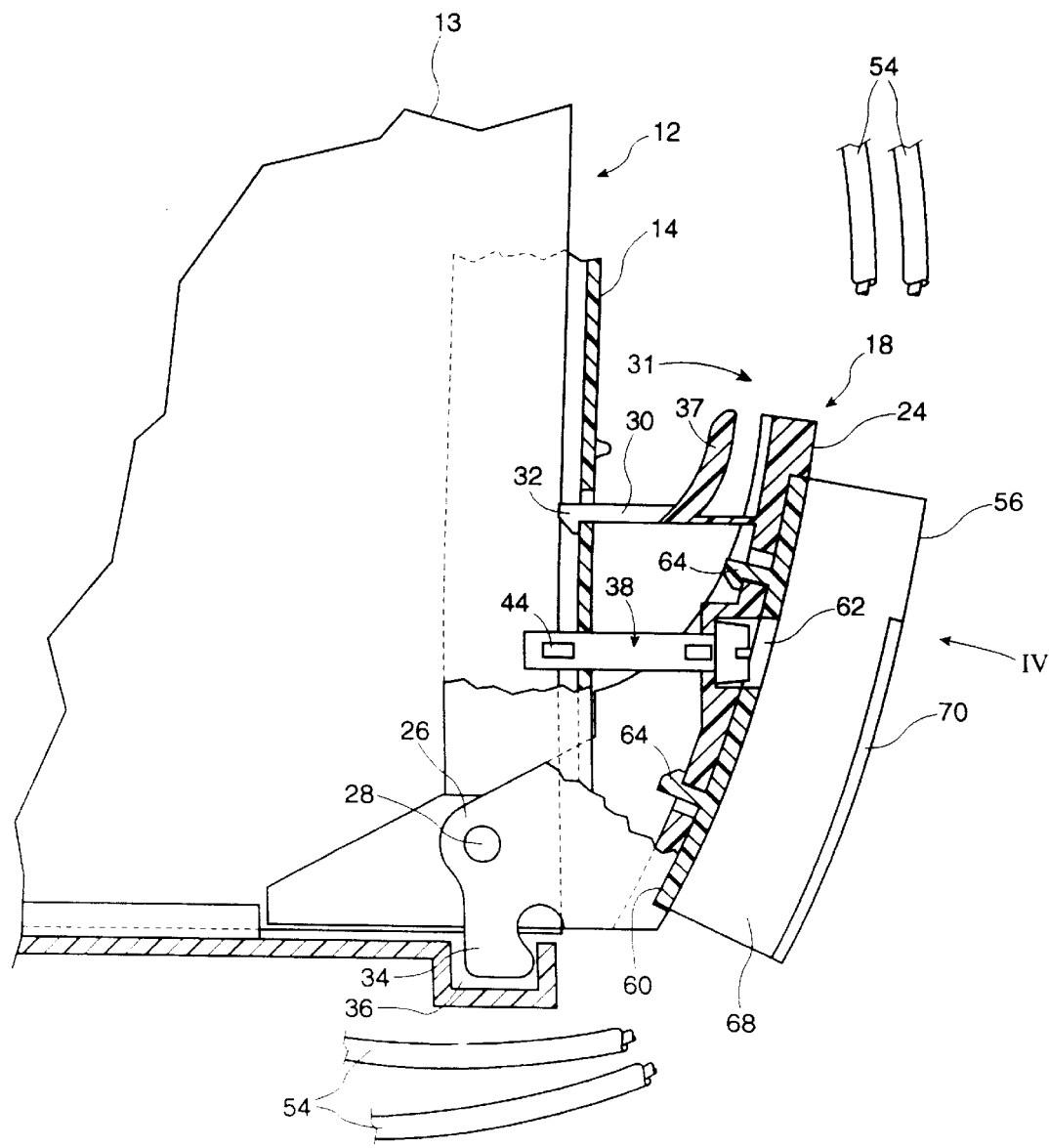
FIG. 3 is a side-elevational view, partly in cross-section, taken in the direction of arrow III in FIG. 2 and of part of a circuit pack.

Each lower latching device 18 is conveniently made as a plastics moulding, e.g. from a polycarbonate material. Each latching device 18 has an operating lever 24 extending substantially radially away from a pivotal axis passing through two lower wings 26 (FIGS. 3 and 4) which extend on either side of the faceplate 14 with a pivot pin 28 passing through the faceplate and through the wings. The upper end region of the operating lever 24 is integrally formed with a resiliently flexible latching element 30 which extends rearwardly with regard to the shelf from a rear face of the operating lever. In a latched position of the latching device 18, the latching element 30 has a latch end 32 extending through an orifice in the faceplate to engage behind the faceplate (FIG. 3). In the latched position of the device 18, the operating lever extends angularly upwards from the pivot pin 28 with a lower extension 34 of the device 18 engaging within a channel 36 of the shelf with the circuit pack in its operating position. To release the latching element 30, before the latching device may be pivoted clockwise (FIG. 3), out of its latched position, a lateral projection 37 of the latching element is manually flexed towards the top end of an operating lever, as shown by the arrow 31 in FIG. 3, thereby moving the latching element upwards.

Figure 4:
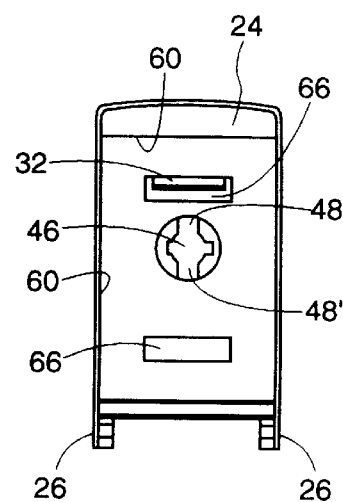
FIG. 4 is a front view upon the latching device in the direction of arrow IV in FIG. 3 with the cable retainer removed.
Figure 5:
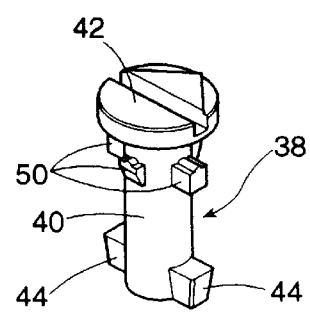
FIG. 5 is an isometric view of a securing member used in combination with the latching device of FIG. 4.

Each latching device 18 is also provided with a means for securing it in its latched position to its faceplate 14 for security reasons as discussed above. For this purpose a securing member in the form of a quarter turn quick release pin 38 is provided, as shown by FIG. 5. This quick release pin is conventional in form. It has a cylindrical body 40 with a slotted head 42 and a pair of diametrically opposed projections 44 remote from the head to engage behind the faceplate 14 after that end of the body 40 has passed through a suitable aperture in the faceplate and the pin has been rotated through 90 degrees (FIG. 3). This rotation holds the latching device in its latched position as shown in FIGS. 2 and 3. The designs of an orifice 46 in the operating lever 24 and the pin 38 are such that the pin is permanently retained within the orifice. As shown by FIG. 4, the basically circular orifice 46 extends from the front to rear through the operating lever 24, the orifice formed with radial slots 48 for passage of other projections 50 of the pin 38 (see FIG. 5) when the pin is inserted through the orifice 46. The arrangement of the securing member 20 of each latching device 16 is similar to that described with regard to the lower end of the faceplate.

Each of the circuit packs 12 is also provided with forwardly facing connectors 52 into which electrical cables 54 are to be connected. These cables must, therefore, extend in front of the faceplates 14, i.e. in front of the shelf 10. According to the present invention, provision is made to prevent the cables from extending across the front of any circuit pack except the individual circuit pack served by a specific cable or cables. Directional and positional control is thus to be provided to each of the cables.

Figure 6:
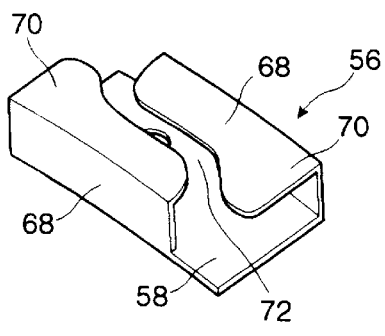
FIG. 6 is an isometric view of the front of a cable retainer of the above Figures.
Figure 7:
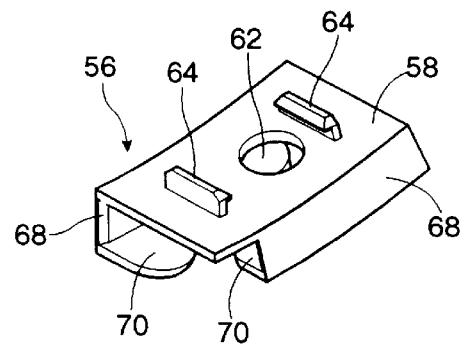
FIG. 7 is isometric view of the rear of the cable retainer.

As shown by FIGS. 1 and 2, and also by FIGS. 6 and 7, to provide for this cable control, each of the lower latching devices 18 is provided with a cable retainer 56 mounted upon the operating lever 24. While the cable retainer and operating lever may be formed integrally, in this particular embodiment they are made separately and the retainer is mounted upon the front of the operating lever. The cable retainer 56 for each latching device 18 comprises a base 58 which is shaped to conform to the upwards curvature of its operating lever 24. The operating lever 24 has a recess 60 (FIG. 3) for accommodating the base 58 with sides of the recess providing a register to position the base 58 accurately in a predetermined location. In this predetermined location, an orifice 62 provided in the base 58 is axially aligned with the orifice 46 in the operating lever. The orifice 62 is sufficiently large in diameter to provide a clearance for access to the head 42 of the pin 38 to enable the pin to be rotated between locking and unlocking positions.

Means are provided for holding the cable retainer 56 in the recess 60. This means comprises a latch means which consists of two parallel latches 64 extending from a rear face of the base 58 of the retainer 56, the latches diametrically opposed across the orifice 62. The latches pass through elongate apertures 66 (FIG. 4) in the operating lever 24 with heads of the latches engaging behind the operating lever (FIG. 3). The latches 64 are resiliently flexible to permit removal of the cable retainer if required.

The cable retainer 56 also comprises two retainer arms comprising two parallel and opposing wings 68 extending out from remote edges of the base 58. The wings 68 have end regions 70 which turn inwardly towards each other across the base to define a curved gap 72 to allow for lateral insertion of cable which is then retained between the base and the retainer arms.

In use of each of the circuit packs 12 incorporating a cable retainer 56 at a lower end of the circuit pack, cables supplying the circuit pack are positioned as shown in FIGS. 1 and 2. As may be seen from these Figures, two cables 54 extend upwardly from a space 76 beneath the shelf 10 to the two connectors 52 extending forwardly of the circuit pack. Each of these cables has been inserted laterally through the gap 72 of its particular cable retainer 56 as discussed above so that positional and directional control is obtained for each of the cables. It follows, therefore, that each of the cables 54 is controlled so that it emerges through the space 76 beneath the shelf 10 in a position directly beneath its individual circuit pack and then extends through the retainer which is oriented vertically to direct the cable upwardly in front of its circuit pack.

As may be seen from the above and from FIGS. 1 and 2, each cable retainer 56 thereby ensures that each of the cables 54 cannot extend across the fronts of circuit packs other than its own individual circuit pack. Hence, the cables cannot extend across any path of movement of any other circuit pack as this circuit pack is moved into and out of its operating position through the front of the shelf. Not only does this simplify and make easier the movement of circuit packs into and out of a shelf, it also avoids the otherwise necessary flexing movement of cables out of the path of movement of the circuit packs. In view of this, cables cannot be damaged by repeated flexing movement as circuit packs are inserted and removed from the shelf.

One other distinct advantage obtained with the structure of the first embodiment is that it renders the removal of an incorrect circuit pack as a most unlikely occurrence. As may be seen from FIGS. 2 and 3, with cables extending through the cable retainers 56, a person proceeding to remove any particular circuit pack from within a shelf must firstly move the cables laterally through the gap 72 in order to reach the quick release pin 38 to enable the latching device 18 to be pivoted out of its latched position. Dealing with removal of cable gives that person an extended time in which to realize he may be removing an incorrect pack, so that a mistake is more likely to be avoided. Even if no quick release pin is required, as in a situation where security is not required, it may be extremely difficult, or even impossible, to pivot the latching device 18 downwardly out of its latched position with the cable present in the retainer. This is because of the resistance of the cable to flexing during forward pivoting movement of the retainer, particularly if there is no superfluous length of cable passing in front of the circuit pack.

In a second embodiment and modifications to be described, elements basically of constructions already discussed will bear the same reference numbers.

Figure 8:
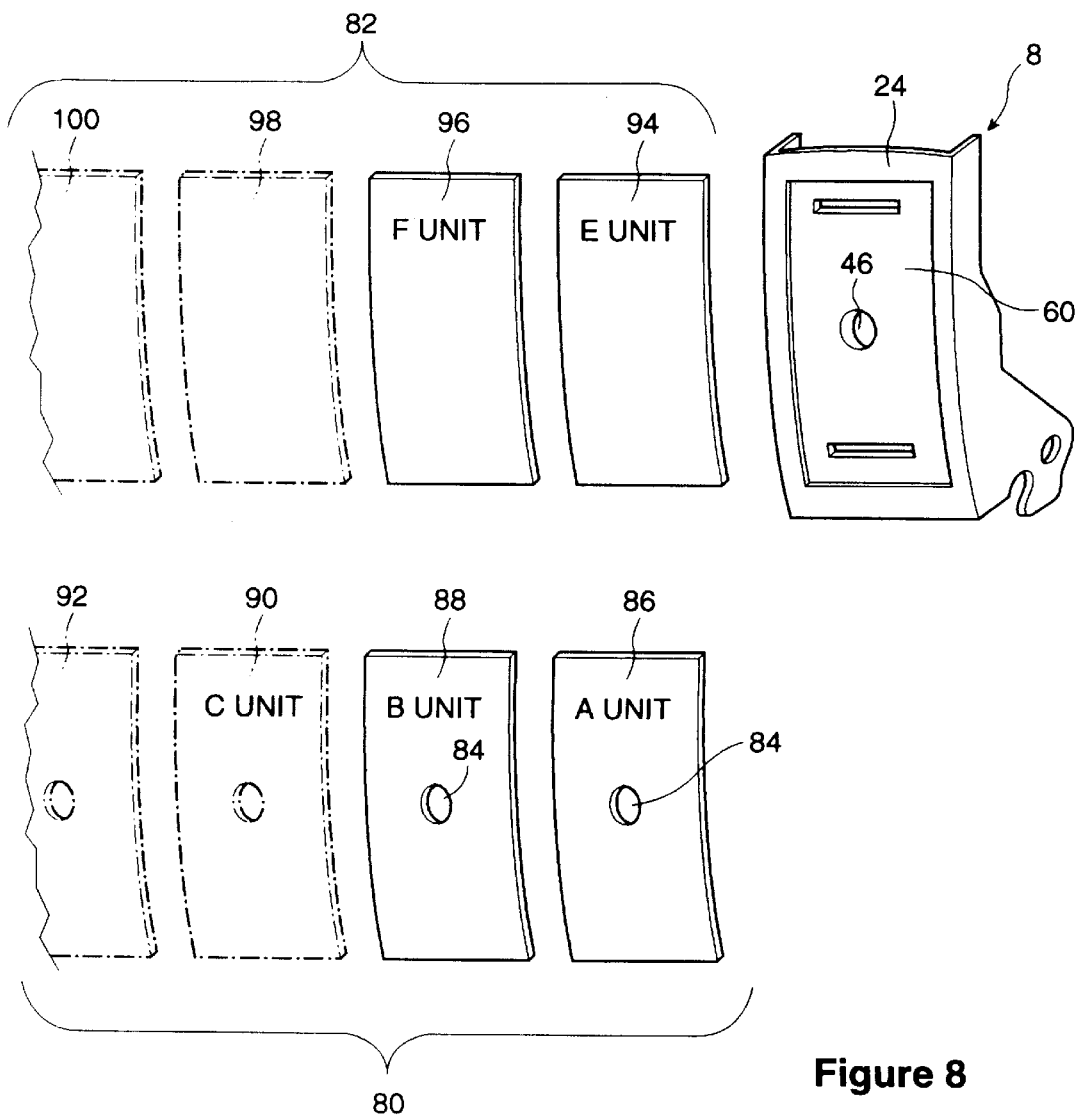
FIG. 8 is an isometric view of a latching device and alternatively selectable covers forming a combination according to a second embodiment.
Figure 10:
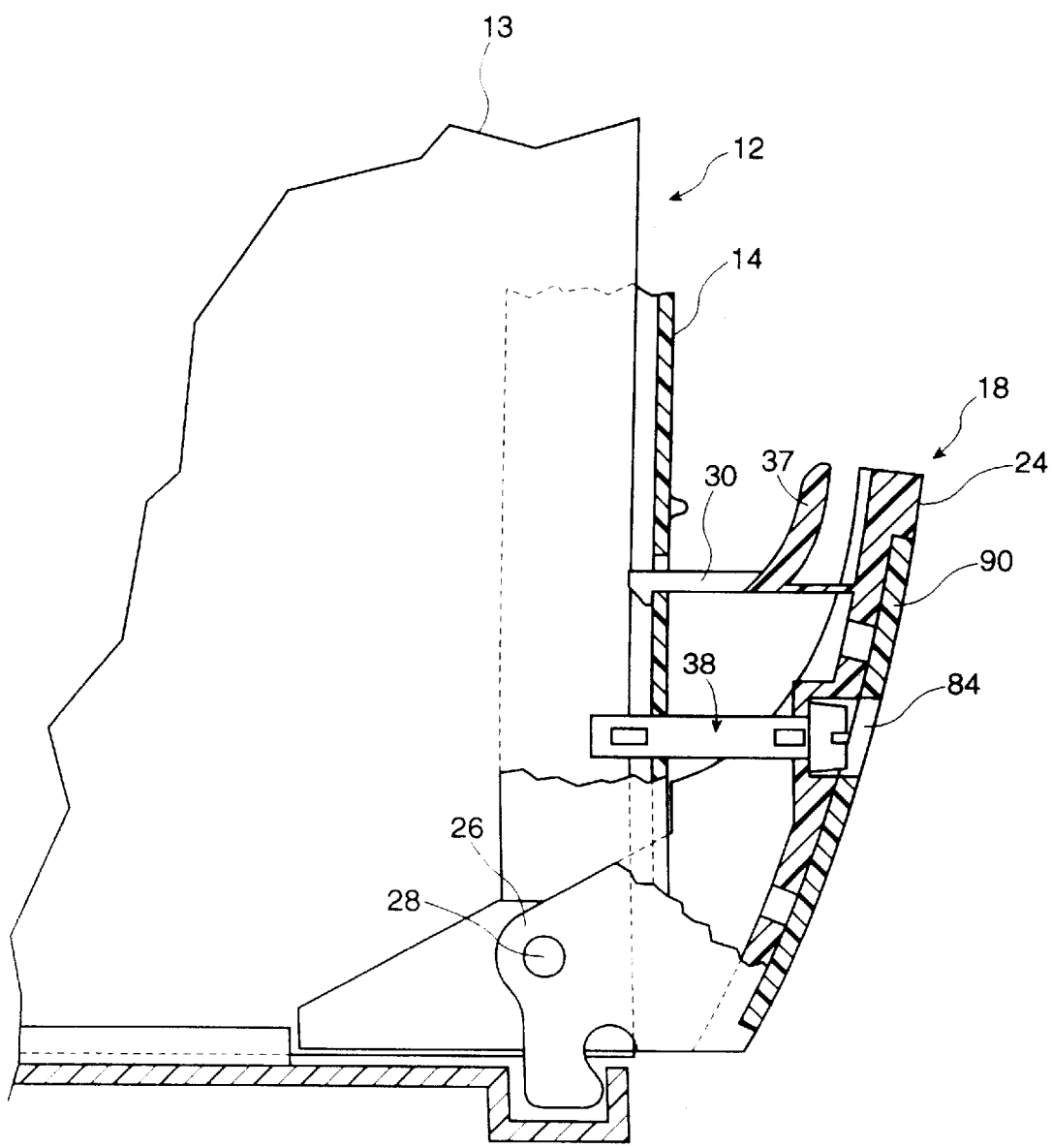
FIG. 10 is a view similar to FIG. 3 of part of a circuit pack fitted with the latching device and cover of FIG. 9.

In the second embodiment, as shown by FIGS. 8, 9 and 10, a combination of latching device and a plurality of covers is shown.

The latching device necessarily is formed with an orifice for the purpose of obtaining access to a securing member, when required. Conveniently, in this second embodiment, the latching device is the latching device 18 of the first embodiment.

It is the intention for this combination to enable this single latching device to be employed upon any circuit pack designed for any use. These uses include any electronic purpose for which the circuit pack is designed and is also suitable for use under security or non-security situations, or whether it is to be used in situations where it is desirable to remove a faceplate while leaving its circuit pack in an operating position in its shelf. To enable this wide range of use of the latching device, the combination is provided with the plurality of covers in two groups, designated 80 and 82, as shown by FIG. 8.

As may be seen from FIG. 8, the group 80 comprises a plurality of rectangular covers each formed with a substantially central orifice 84, the covers all being of the same size. These covers are substantially planar and are conveniently formed by molding or stamping from plastic sheet, e.g. made of a polycarbonate material. Four covers 86, 88, 90 and 92, are shown, but more covers may be included in the group if required. The orifices 84 are provided in specific positions in the covers. Each cover 86 to 92 has contact adhesive provided on a rear surface and the cover may be located within the recess 60 of the operating lever 24 for attachment to the base of the recess by use of the adhesive. The covers are also flexible to enable them to conform to the base shape of the recess. Each cover is alternatively selectable, therefore, for mounting within the recess 60 and in a predetermined location provided by a register afforded by edges of the recess which closely oppose edge surfaces of the cover. When the selected cover 86 to 92 is mounted in the recess 60, its orifice 84 is aligned with the orifice 46 and has a sufficiently large diameter to enable access for a tool to reach a securing member through the orifice 84.

All of the covers of group 80 are visually differentiated from one another for the purpose of indicating the use to which a particular circuit pack is to be put in a shelf. These differentiations may take the form of word and letter combinations or acronyms printed upon the fronts of the covers. This is exemplified, for the purposes of this description, by the terms "A unit", "B unit", and "C unit" etc., upon the covers of the group 80 in FIG. 8.

With regard to the covers in the group 82, these covers, as is shown by the illustrated covers 94 to 100, are not formed with orifices, as is present in any of the covers of group 80. Each of these covers 94 onwards is also selectable, dependent upon the use to which a particular pack is to be put, for location within the recess 60 of the operating lever in which it is in a predetermined location, as discussed above for the covers of group 80. The covers 94 onwards are visually differentiated from one another in a manner similar to those of the group 80, e.g. by printed designations for the purpose of this description, of "E unit", "F unit", etc.

As may be seen from the above, therefore, the single latching device 18 may be used in any desired circumstances without need of a latching device of different construction for any particular purpose.

FIG. 9 illustrates the use of the latching device 18 with any chosen cover of the group 80, e.g. cover 90 and shows the orifice 84 aligned with the orifice 46 for access to a locking member. As shown by FIG. 10, which is a view similar to FIG. 3, and has like parts except for the omission of the cable retainer 56 of FIG. 3, the cover 90 is received within the recess 60 to enable the access tool to contact the head 42 of the release pin 38. The recess 60 thus provides a predetermined cover mounting position for any selected cover.

Figure 11:
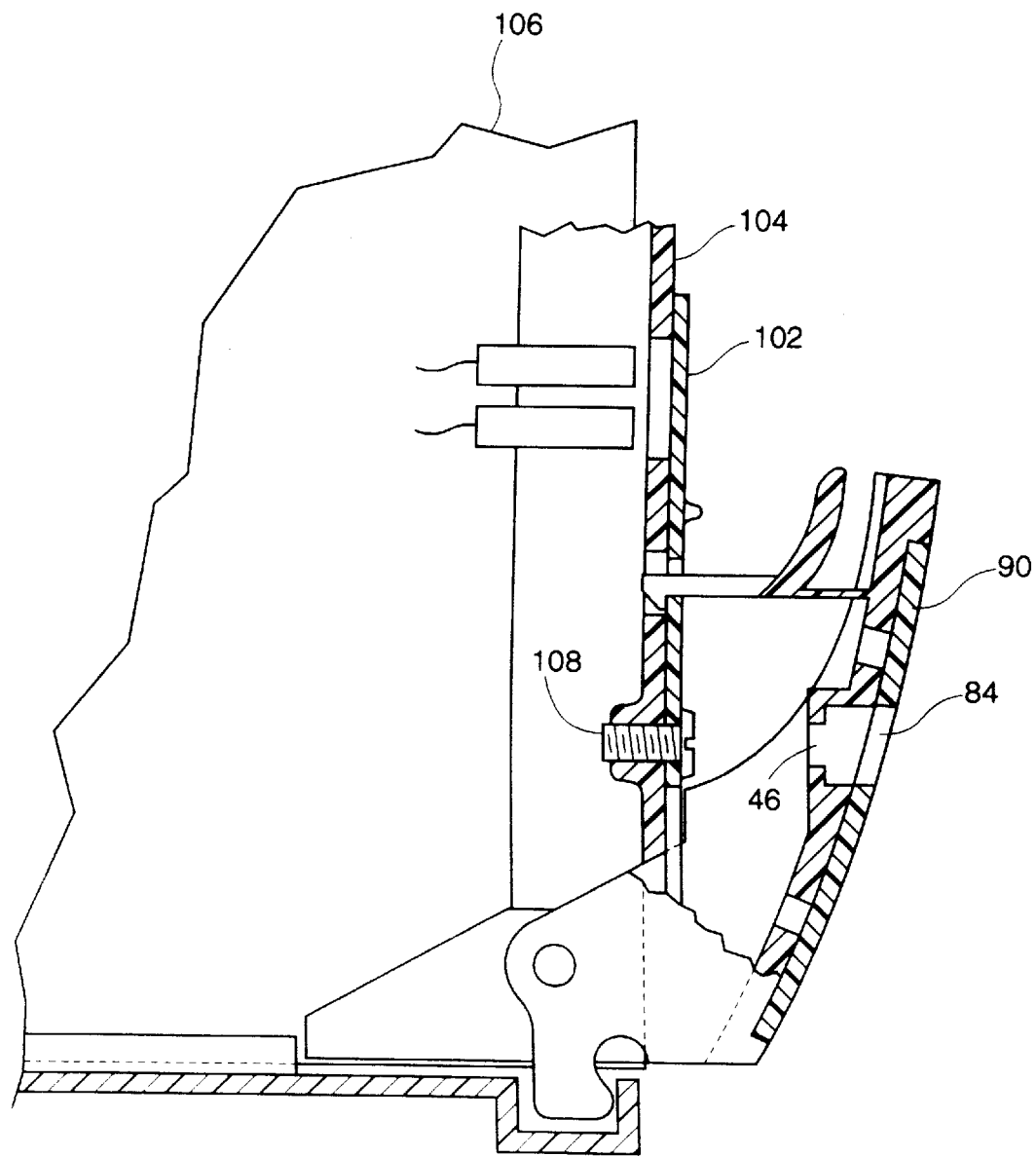
FIG. 11 is a view similar to FIG. 3 and showing a first modification of the second embodiment.

In a first modification of the second embodiment, as shown by FIG. 11, a faceplate 102 is removably mounted upon a faceplate mount 104, which is itself secured to a printed circuit board 106 of a circuit pack. This faceplate is mounted to the faceplate mount by means of a screw 108 at a lower end of the faceplate, the screw being accessible for removal and insertion purposes through the orifice 46. With a cover, e.g. cover 90, of the group 80 received in the recess 60 the specific tool is easily inserted through the aligned orifices 46 and 84 so as to reach the screw 108. The faceplate is also secured to the mount by an upper screw (not shown) which extends through an operating lever of the upper latching device which is not subject to the present invention.

Alternatively, where security for a circuit pack is not required within a shelf, a cover e.g. cover 96, is selected from the group 82 of covers and is mounted in the recess 60, as shown by FIG. 12. As with the chosen cover of the group 80, the selected cover for this purpose is dependent upon the specific use of the circuit pack and bears the appropriate designation for this use. As may be seen from FIG. 12, the selected cover from group 82, when placed within the recess 60 extends across and completely obscures the orifice 46 as no securing member is included in this particular construction. Hence, although the latching member is provided with an orifice, in cases where no securing member is used, then obscuring the orifice 46 provides a pleasing appearance similar to that obtained if the orifice 46 were omitted.

In a second modification of the second embodiment, the combination of the second embodiment is basically as described above, but further includes in this modification two covers comprising cable retainers 120 and 122 and two groups 124 and 126 of identification labels, as shown by FIG. 13. The group 124 comprises labels designated 128 upwards and the group 126 comprises labels designated 136 upwards. The label in the groups 124 and 126 are visually differentiated from one another in the same manner respectively as the covers in the two cover groups 80 and 82 of the second embodiment and each label has contact adhesive on its rear surface. Thus, each label carries a printed word or letter combination relating to a specific use of a circuit pack to which the label is to be added. The group 124 of labels is for use when security is required for a circuit pack in a shelf. The other group 126 is for use when no security is required or when a faceplate may need to be removed from its mount in the manner discussed in regard to FIG. 11 above.

The cable retainer 120 is of the same construction as the cable retainer 56 of the first embodiment and has an orifice 62 in its base 58. The retainer 120 does however in addition, have a rectangular recess 142 on the outer surface of each of its wings 68. Each recess 142 is to accommodate a chosen label of the group 124 with sides of the recess closely opposing edges of the label to act as a register for accurate positioning.

The cable retainer 122 is also of the same construction as the cable retainer 56 but is devoid of an orifice 62 in its base 58. The cable retainer 122 also has recesses 142 on its wings 68, these being for location of a chosen label of the group 126.

Where it is desired to provide a cable retainer upon an operating lever of a latching device similar to that shown in the first embodiment, the cable retainer 120 is used as is the case for the retainer 56 in the first embodiment. Where access is required through the orifice 62 to a securing member holding the latching device in latched position, a chosen label from group 124 is located in the or each recess 142. The retainer 120 may also be used when a securing member holds a faceplate to its mount as discussed above with reference to FIG. 11. The retainer 120 would have, in this case, its base 58 received in the recess 60 in place of the cover 90 in FIG. 11. In this second modification the cable retainer 120 carries in at least one of its recesses 142 a chosen identification label, i.e. label 136, from the group 126 (FIG. 14) to convey information relating to that individual circuit board. In certain cases where more information is required at the front of the shelf and relating to a particular circuit board, then the associated cable retainer 120 has an identification label from the group 124 located in each of its recesses 142.

In cases where security is not required in use of a circuit pack within a shelf and thus no securing member is being used, or in a construction where the faceplate is not required to be removed from its mount while the circuit pack remains in the shelf, then the cable retainer 122 is assembled onto the operating lever of the latching device (not shown). This then obscures the orifice 46 in the latching device when viewed from the front of the shelf. A chosen identification label from the group 126 is mounted within the or each recess 142 of the retainer 122 to identify the use of the particular circuit pack to which the cable retainer 122 is fitted.

It follows that in the second modification of the second embodiment, not only may the same latching device structure be used in all situations concerning the use of circuit packs as discussed for the second embodiment, but cable retainers are provided for both security and nonsecured situations to obtain the advantages also of the first embodiment.

What is claimed is:

1. A latching device comprising:
   an operating lever comprising a front and a rear;
   means to permit the device to be pivotally mounted upon a faceplate of a circuit pack; and
   a cable retainer carried upon the front of the operating lever and oriented to direct cable in a generally radial direction from the pivotal axis of the pivotal mounting means.

2. A latching device according to claim 1 wherein the cable retainer is detachably mounted upon the operating lever by a retainer mounting means.

3. A latching device according to claim 2 wherein the retainer mounting means comprises latch means.

4. A latching device according to claim 2 wherein the retainer mounting means comprises a plurality of latches extending from the cable retainer and the operating lever is formed with a plurality of latch receiving apertus, each of said apertures for receiving one of said latches.

5. A latching device according to claim 1 wherein the cable retainer defines an opening for lateral insertion of cable into and for removal of cable from within the cable retainer.

6. A latching device according to claim 2 wherein the operating lever is formed from front to rear with an orifice allowing a securing member to extend therethrough into the faceplate and the orifice is covered with the cable retainer mounted upon the front of the operating lever.

7. A latching device according to claim 2 wherein the operating lever is formed from front to rear with a first orifice allowing a securing member to extend therethrough into the faceplate, the cable retainer is formed with a second orifice, the first and second orifices aligned to allow access to the first orifice through the second orifice.

8. A latching device to claim 1 wherein the cable retainer and the operating lever are integrally formed.

9. A latching device to claim 1 wherein the operating lever has a register to located the cable retainer in a cable retainer mounting position.

10. A latching device to claim 9 wherein the cable retainer mounting position comprises a recess formed in the front of the operating lever and the register comprises sides of the recess to located the cable retainer within the recess.

11. An arrangement for a circuit pack, the arrangement comprising an elongate faceplate having a front and a latching device pivotally mounted about a pivotal axis to and in front of the faceplate, the latching device comprising;
    an operating lever comprising a front and a rear; and
    a cable retainer carried upon the front of the operating lever, the cable retainer being oriented to direct a cable retained thereby to extend longitudinally along the faceplate.

12. An arrangement according to claim 11 wherein the cable retainer is detachably mounted upon the operating lever by a retainer mounting means.

13. An arrangement according to claim 12 wherein the retainer mounting means comprises a latch means.

14. An arrangement according to claim 11 wherein the cable retainer comprises an opening allowing lateral insertion of a cable in the cable retainer and lateral removal of a cable from within the cable retainer.

15. An arrangement according to claim 12 wherein the operating lever is formed from front to rear with an orifice allowing a securing member to extend therethrough into the faceplate and the orifice is covered with the cable retainer mounted upon of the operating lever.

16. An arrangement according to claim 12 wherein the operating lever is formed from front to rear with a first orifice allowing a securing member to extend therethrough into the faceplate and the cable retainer is formed with a second orifice, the first and second orifices aligned to allow access to the first orifice through the second orifice.

17. A combination of a latching device and a plurality of covers wherein:
    the latching device comprises an operating lever having a cover mounting position and being formed with a first orifice extending through the lever from front to rear; and
    sets of the plurality of covers being visually differentiated from one another to indicate different circuit packs with a first set of the plurality of covers each formed with a second orifice at a location through the cover and a second set of the plurality of covers being free of an orifice at a corresponding location.

18. A combination according to claim 17, wherein the covers are alternatively selectable for mounting in the cover mounting position with, in the case of one selection, the second orifice of a cover from the first set being aligned with the first orifice to allow access to the first orifice through the second orifice and, in the case of another selection, a cover from the second set covering the first orifice of the operating lever.

19. A combination according to claim 18 in which each cover of the first set of plurality of cover is generally planar.

20. A combination according to claim 19 wherein the sets of plurality of covers are visually differentiated by a form having printing, the form affixed to a front of the cover mounting position.

21. A combination according to claim 18 in which each cover of the second set is generally planar.

22. A combination according to claim 17 wherein the operating lever has a register to locate a selected cover in the cover mounting position.

23. A combination according to claim 22 wherein the cover mounting position is provided by a recess formed in the operating lever and the register is provided by sides of the recess to locate the selected cover within the recess.

24. A combination according to claim 17 having a further cover comprising a cable retainer which is mountable in the cover mounting position.

25. A combination according to claim 24 comprising a plurality of identifying labels, the cable retainer having a label mounting position and the labels being visually differentiated from one another to indicate different uses of circuit packs, the labels being selectable for mounting in the label mounting position.

26. A combination according to claim 25 wherein the label mounting position is provided by a recess formed in the cable retainer and a register is provided by sides of the recess to locate the selected label within the recess.

27. A latching device comprising:

an operating lever pivotally mounted to a faceplate of a circuit pack; and a cable retainer provided with the operating lever, the cable retainer oriented to direct cables.

28. A latching device according to claim 27 wherein the cable retainer is oriented to direct a cable held thereby to extend longitudinally along said faceplate.

29. A latching device according to claim 28 wherein the cable retainer and the operating lever are integrally formed.

30. A latching device according to claim 28 wherein the operating lever has a register to locate the cable retainer in a cable retainer mounting position.

31. A latching device according to claim 30 wherein the cable retainer mounting position comprises a recess formed in the front of the operating lever and the register comprises sides of the recess to locate the cable retainer within the recess.

32. A latching device according to claim 28 wherein the cable retainer is carried upon the operating lever.

* * * * *